United States Patent
Keuper

(10) Patent No.: US 7,080,932 B2
(45) Date of Patent: Jul. 25, 2006

(54) LED WITH AN OPTICAL SYSTEM TO INCREASE LUMINANCE BY RECYCLING EMITTED LIGHT

(75) Inventor: Matthijs H. Keuper, San Jose, CA (US)

(73) Assignee: Philips Lumileds Lighting Company, LLC, San Jose, CA (US)

( * ) Notice: Subject to any disclaimer, the term of this patent is extended or adjusted under 35 U.S.C. 154(b) by 203 days.

(21) Appl. No.: 10/765,312

(22) Filed: Jan. 26, 2004

(65) Prior Publication Data

US 2005/0162849 A1    Jul. 28, 2005

(51) Int. Cl.
*F21V 7/04* (2006.01)
(52) U.S. Cl. .................... 362/613; 362/623
(58) Field of Classification Search ........ 362/612–617; 359/834, 833
See application file for complete search history.

(56) References Cited

U.S. PATENT DOCUMENTS

| | | | |
|---|---|---|---|
| 3,877,052 A | 4/1975 | Dixon et al. ................ 357/17 |
| 3,968,564 A | 7/1976 | Springthorpe ............... 29/580 |
| 5,606,444 A | 2/1997 | Johnson et al. | |
| 5,894,196 A | 4/1999 | McDermott | |
| 6,229,160 B1 | 5/2001 | Krames et al. ............. 257/94 |
| 6,323,063 B1 | 11/2001 | Krames et al. ............. 438/116 |
| 6,948,840 B1 * | 9/2005 | Grenda et al. ............ 362/555 |
| 2003/0063456 A1 * | 4/2003 | Katahira ...................... 362/27 |
| 2004/0223314 A1 * | 11/2004 | Ching-Huang et al. ....... 362/31 |
| 2005/0180167 A1 * | 8/2005 | Hoelen et al. ............. 362/613 |

FOREIGN PATENT DOCUMENTS

| | | |
|---|---|---|
| EP | 0 683 574 A1 | 11/1995 |
| EP | 0 881 514 A1 | 12/1998 |
| EP | 1 416 545 A2 | 5/2004 |
| JP | 57-053839 | 3/1982 |
| JP | 2-39578 | 2/1990 |

OTHER PUBLICATIONS

European Search Report, 4 pages.

* cited by examiner

*Primary Examiner*—Ali Alavi
(74) *Attorney, Agent, or Firm*—Patent Law Group LLP

(57) ABSTRACT

The amount of usefully captured light in an optical system is increased by concentrating light in a region where it can be collected by the optical system. In one embodiment, a light emitting diode is disposed on a first surface of a transparent member, which includes an exit surface. The transparent member includes a reflective element on a second surface and is shaped such that light emitted from the light emitting diode is directed toward the exit surface. A portion of the first surface of the transparent member between the first light emitting diode and the exit surface of the transparent member first surface is coated with a reflective coating. The portion of the first surface with the reflective coating may be larger than the width of the light emitting diode. In one embodiment, the transparent member is formed from two separate transparent elements.

30 Claims, 3 Drawing Sheets

LED WITH AN OPTICAL SYSTEM TO INCREASE LUMINANCE BY RECYCLING EMITTED LIGHT

FIELD OF THE INVENTION

The present invention relates generally to increasing the brightness of a light emitting diode light source.

BACKGROUND

FIG. 1 illustrates a lens 12 transmitting light generated by a light source 10 such as a light emitting diode. A key issue in designing light sources to be used with optical systems comprised of passive optical imaging elements, such as lens 12, is illustrated in FIG. 1. Only light emitted from the source area that is consistent with the optical invariant or etendue of lens 12 can be usefully focused onto the target area 20 (for example, a transparent microdisplay). The etendue of a given optical system is defined as:

$$E = \iint (\cos\theta) dA d\Omega \quad (1)$$

where $\theta$ is the angle between the normal to the surface element $dA$ and the centroid of the solid angle element $d\Omega$. Etendue is a geometric property of the optics related to the divergence and cross-sectional area of the beam. The etendue cannot be decreased for if it were, the energy density at the image could exceed that of the source, violating the second law of thermodynamics.

Source 10 may be, for example, a light emitting diode (LED), which emits light in all directions. As illustrated in FIG. 1, only light 16 emitted from the center of the top surface of source 10 and within the cone accepted by the lens can be focused on the target 20. Light 14 emitted from the top of source 10 far from lens 12, and emitted near lens 12 but at an angle outside the etendue-limit, as well as light emitted from the sidewalls of source 10 (not shown), is not utilized by lens 12, and is lost. In the case of a light emitting diode light source 10, as the area of source 10 increases, in general the total light emitted from source 10 may also increase. However, the etendue of lens 12 imposes a maximum value on the amount of light flux that an optical system using lens 12 can utilize, regardless of how large light source 10 is made.

There are several ways to increase the amount of usefully captured light in an optical system. First, a lens with a larger diameter 20 may be used. However, as the diameter of a lens increases, the cost of the lens increases. Thus, it is desirable to limit the size of the lenses in an optical system, in order to control the cost.

Second, the light flux per unit area of the light source may be increased. In the case of a light emitting diode light source, the amount of light generated per unit area is generally proportional to the electrical current density in the light generating layers of the device. Thus, the light per unit area may be increased by increasing the current density. However, the efficiency of light emitting diodes usually falls at high current densities due to, for example, heating effects, saturation in the light emitting layers of the charge carriers that recombine to produce light, or the loss of confinement of the charge carriers that recombine to produce light. The loss of light generating efficiency at high current density limits the amount of light generated per unit area that can be created in a light emitting diode.

SUMMARY

In accordance with embodiments of the present invention, the amount of usefully captured light in an optical system may be increased by concentrating light in a region where it can be collected by the optical system.

In one embodiment, an optical system includes at least a first light emitting diode and a transparent member that has a first surface, a second surface, and an exit surface. The first light emitting diode is disposed on the first surface of the transparent member. A reflective coating is disposed on a portion of the first surface of the transparent member between the first light emitting diode and the exit surface of the transparent member. Either a second light emitting diode or a reflective coating is disposed on the second surface of the transparent member. The transparent member is shaped such that light emitted from the at least one light emitting diode is directed toward the exit surface of the transparent member. In some embodiments, the first and second surfaces form a wedge, with the apex of the wedge opposite the exit surface.

In another embodiment, an optical system includes a first light emitting diode, a first transparent member and a second transparent member. The first transparent member has a first surface, a second surface, and a first exit surface, where the first light emitting diode is disposed on the first surface and the first surface and second surface are opposing surfaces and are non-parallel. Either a second light emitting diode or a reflective coating is disposed on the second surface. The second transparent member has a third surface, a fourth surface, an entry surface and a second exit surface, where entry surface is coupled to the first exit surface and is opposite the second exit surface. The third surface and fourth surface are opposing surfaces and are non-parallel. A reflective coating is disposed on the third surface and the fourth surface. The first and second transparent members are shaped such that light emitted from the first light emitting diode is directed toward the second exit surface.

In another embodiment, an optical system includes a light emitting diode and a wedge that is defined by the first light emitting diode along a first surface, a second inwardly reflective surface and a third inwardly reflective surface that are opposite each other and adjacent to the first surface, and a fourth inwardly reflective surface that is opposite to and non-parallel with the first surface. The wedge is shaped such that light emitted from the light emitting diode is directed toward an exit area defined by a wide end of the wedge.

DETAILED DESCRIPTION

In accordance with embodiments of the invention, the amount of light captured in an optical system may be increased by directing light from the source into the etendue-limit of the optical system so that it can be captured by the optical system. The light source may be a semiconductor light emitting device such as a light emitting diode. Embodiments of the invention are applicable to semiconductor light emitting devices of various materials systems, including, for example, III-V systems such as III-nitride, III-phosphide, and III-arsenide, and II-VI systems.

Figure 1:
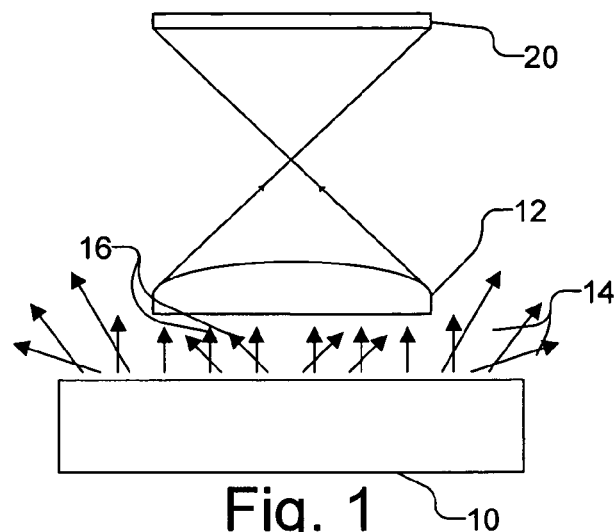
FIG. 1 illustrates an optical system including a light emitting diode, a lens, and a target image area.
Figure 2:
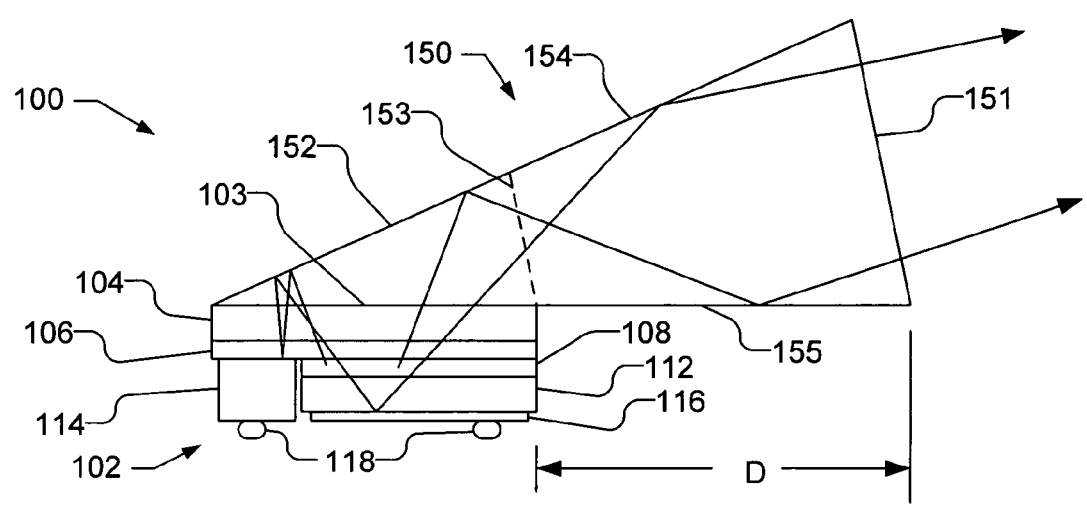
FIGS. 2 and 3 illustrate respective cross-sectional and perspective views of a device with an LED disposed on the side of a transparent wedge.
Figure 3:
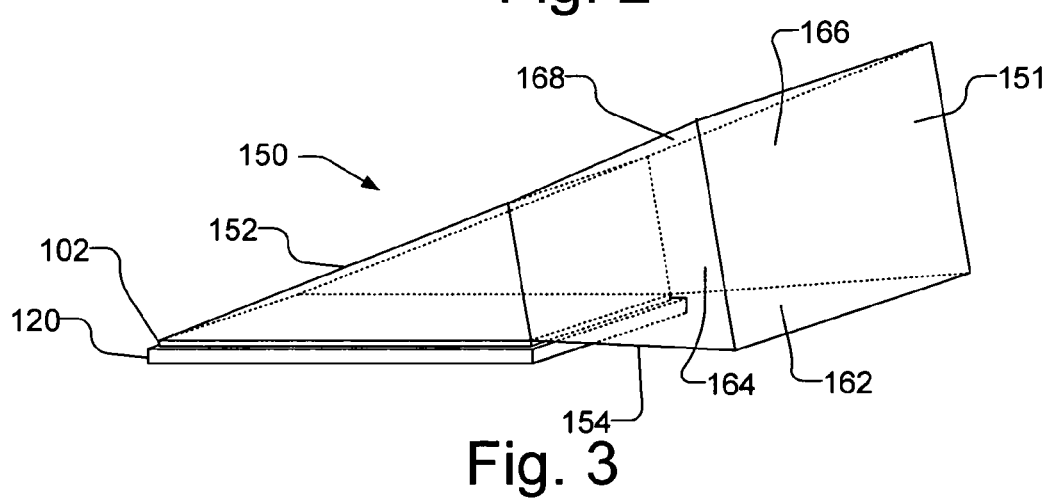

FIGS. 2 and 3 illustrate a device 100 that may be used to direct light emitted by a source into the etendue-limit of an optical system. FIG. 2 shows a cross sectional view of the device 100, which has a light source 102, such as a light emitting diode, disposed along one side of a transparent wedge 150. FIG. 3 shows a simplified perspective view of the device 100. The sides of the wedge 150 are coated with a reflective coating so that the light can only exit the surface 151 of the wedge 150. If desired, the sides of the light source 102 may also be coated with a reflective coating so that light that would otherwise exit through the side of the light source 102 is directed toward the wedge 150. The shape of the wedge 150 directs all light to the exit surface 151. In some embodiments, exit surface 151 has the same dimensions as a single LED, though it may be larger or smaller. The size and shape of the wedge 150 and the exit surface 151 of the wedge 150 is selected to correspond to the etendue-limit of an optical system (not shown).

In one embodiment, the reflective coating on wedge 150 may be, for example, a metal having a reflectivity greater than 90%. Examples of suitable metals are as silver, aluminum, rhodium, and gold. The reflective metal may be selected based on the material on which it is to be deposited, or the wavelength of the light it is to reflect. For example, gold is highly reflective of light in the red or infra-red wavelength ranges.

In another embodiment, the reflective coating on wedge 150 may be, for example, a non-specular (white) highly-reflective layer. One example of a suitable material is a white powder or paint containing barium sulfate, such as White Reflectance Coatings available from Munsell Color Services of New Windsor, N.Y. The non-specular layer may be applied by, for example, painting or electrophoretic deposition.

Wedge 150 may be manufactured, for example, as a single piece of sapphire, glass, acrylic, silicone, or any other suitable material capable of maintaining transparency when exposed to the light and heat emitted by light source 102. In another embodiment, the wedge 150 is manufactured from two or more separate elements that are attached by, for example, gluing, pressing, or bonding. Thus, as illustrated in FIG. 2, the wedge 150 can be made from a small wedge element 152 and a wedge extension element 154 that acts as a collimating optic. The light source 102 may be attached to the wedge 150 by, for example, gluing, pressing, or bonding. The use of a small wedge element with a light source is discussed in U.S. Ser. No. 10/669,789, filed on Sep. 23, 2003, by Frank M. Steranka, Daniel A. Steigerwald and Matthijs H. Keuper, which is owned by the assignee of the present disclosure, and is incorporated herein by reference.

In another embodiment, the wedge 150 is a cavity defined by a plurality of inwardly reflective surfaces. Thus, as illustrated in FIG. 3, for example, the wedge 150 is defined by the light source 102 along a first surface 162, a second reflective surface 164 and third reflective surface 166 that are approximately perpendicular to the first surface 162, and a fourth reflective surface 168 that is non-parallel with the first surface 162. The fourth reflective surface 168 and the first surface form an apex 170 of the wedge 150 at one end and the wide end of the wedge 150 at the opposite end, where the wide end of the wedge 150 serves as the exit area 151. The surfaces 162, 164, 166, 168 form the wedge 150 such that light emitted form the light source 102 is reflected by the surfaces and directed toward the exit area 151 of the wedge 150. A portion of the first surface 162 may also be a reflective surface, such as mirrored glass, e.g., between the light source 102 and the exit area 151. If desired, more than one light source 102 may be used along the first surface and the fourth reflective surface 168 may be one or more light sources, such as a light emitting diodes.

Figure 4:
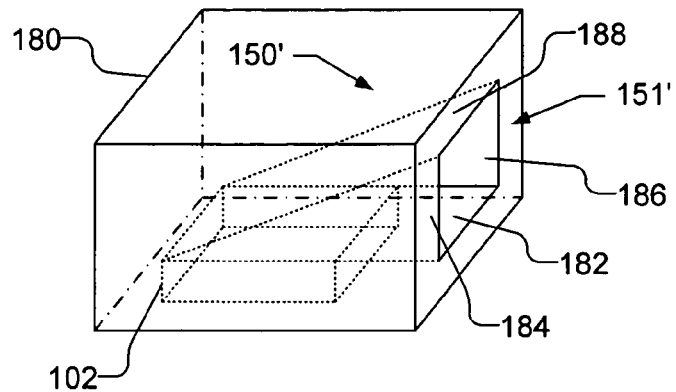
FIG. 4 illustrates a perspective view of a solid body that has an internal cavity with reflective surfaces that defines a wedge.

The surfaces 164, 166, and 168 may be formed by separate reflective elements, e.g., mirrored glass, that are coupled together along the edges, e.g., by glue or epoxy or any other appropriate technique, to form the wedge 150. Alternatively, the wedge 150 may be formed from a solid body, such as a reflective metal, that is hollowed to form an internal cavity with reflective surfaces that define the wedge. FIG. 4 illustrates a perspective view of a solid body 180 that has been hollowed to form a wedge 150'. Thus, the wedge 150' is defined by the internally reflective surfaces 182, 184, 186, and 188 of the solid body 180 and the exit area 151'. The light source 102 may be located externally to the solid body 180 or may be fit into the solid body 180 flush with surface 182.

The wedge extension element 154 has an entry face that is approximately the same dimensions as the exit face of the small wedge element 152. FIG. 2 illustrates a separation between the small wedge element 152 and the extension element 154 in the wedge 150 as a broken line 153 to indicate that the wedge 150 may be manufactured from one element or two (or more) elements. The extension element 154 may be formed of the same material as the small wedge element 152 or other material that has the desired optical properties, e.g., the same coefficient of refraction as the small wedge 152.

The radiant intensity distribution of the light leaving the wedge extension element 154 is narrower than the distribution of the light entering the wedge extension element 154. The narrow distribution of light is particularly advantageous in a projection application because the optical system that is required to get the light from the light source to the target area can be greatly simplified if the light source has a narrow radiation pattern.

As can be seen in FIG. 2, an embodiment of the present invention includes a wedge 150 that extends laterally beyond the edge of the light source 102. The surface 155 of the wedge extends a distance D between the light source 102 and the exit surface 151. In general, the surface 155 extends in a direction that is parallel to the face 103 of the light source 102. The portion of the surface 155 that is between the light source 102 and the exit surface 151 is covered with a reflective coating. The distance D may be greater than the width of the face 103 of the light source 102. The use of an extended wedge provides superior collimation of the radiation emitted by the light source 102.

As illustrated in FIG. 2, the light source 102 may be a light emitting diode (LED), which includes a layer of first conductivity type 106 formed on a substrate 104. If the device shown in FIG. 2 is a III-nitride light emitting diode, first conductivity type layer 106 may be an n-type III-nitride layer and substrate 104 may be sapphire, SiC, GaN, or any other suitable substrate. A light emitting region 108, also referred to as the active region, is formed on first conductivity type layer 106, then a layer of second conductivity type 112 is formed on active region 108. A first contact 114 is connected to first conductivity type layer 106 and a second contact 116 is connected to the second conductivity type layer 112. At least one of contacts 114 and 116 may be reflective. Interconnects 118 connect the light emitting diode to a submount 120 (shown in FIG. 3). Interconnects 118 may be, for example, solder bumps or gold bumps.

The semiconductor layers in an LED are typically quite transparent to light at the emission wavelength. Thus, light rays 130 and 132 are transmitted through layers 108, 106 and 104 without absorption and are reflected off the reflective coating on the opposite wall of the wedge 150. The light rays may be reflected back through the LED 102, e.g., light ray 130 is reflected back through layers 104, 106, and 108 and is reflected off contacts 114 and 116. The light rays reflect off the sides of the wedge 150 until the light rays escape the wedge 150 through the exit surface 151. Thus, the wedge 150 prevents light from escaping the device 100 outside an area that matches the etendue-limit of the desired optical system.

Figure 5:
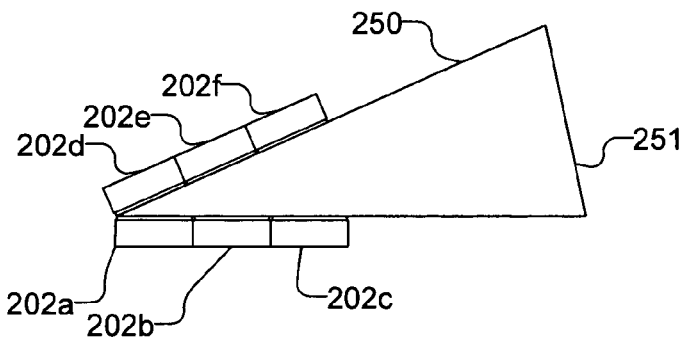
FIG. 5 illustrates a device with multiple LEDs disposed on the sides of a transparent wedge.

If desired, multiple light sources may be affixed to a wedge. Moreover, light sources may be affixed to multiple sides of a wedge. FIG. 5, by way of example, illustrates an embodiment, in which multiple light sources 202a, 202b, 202c are affixed to one side of a wedge 250, while additional light sources 202d, 202e, and 202f are affixed to another side of the wedge 250. The light sources may be LEDs similar to that described in reference to FIG. 2. The light sources may be affixed to opposing sides of the wedge 250, or alternatively, may be affixed to non-opposing sides of the wedge 250. The portions of the wedge 250 not affixed to a light sources, other than the exit surface 251, may be coated with a reflective coating.

Figure 6:
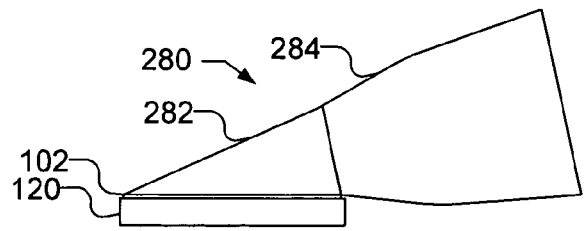
FIGS. 6 and 7 illustrate devices with an LED disposed on the side of a transparent wedge with a convex shape and concave shape, respectively.

In accordance with an embodiment of the present invention, the geometry of the wedge may vary. For example, as shown in FIG. 2, the wedge 150 may have planar sides and is thus, a planar wedge. Alternatively, the taper of the wedge may be non-linear, i.e., one or more sides of the wedge are non-planar and, thus, the wedge is non-planar. FIG. 6 illustrates an embodiment in which a portion of the wedge 280 has a convex shape. As illustrated in FIG. 6, the wedge extension element 284 may have convex shape, while the small wedge element 282 is a planar wedge. Of course, if desired, a single element may be used and/or portions of the small wedge element 282 may also have a complex shape.

Figure 7:
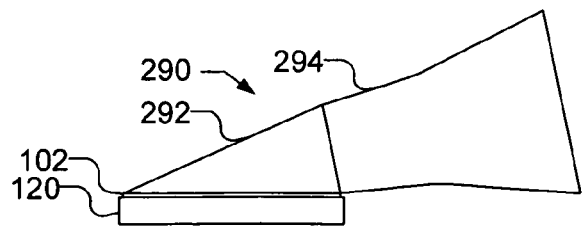

FIG. 7 illustrates an embodiment that is similar to that shown in FIG. 6, but a portion of the wedge 290, e.g., the wedge extension element 294, has a concave shape. As described above, if desired, a single element may be used and/or portions of the small wedge element 282 may also have a complex shape.

Of course, other complex shapes may be used with a non-planar wedge. For example, the entire wedge or a portion of the wedge may have a parabolic or elliptical shape or a complex compound or faceted shape.

Figure 8:
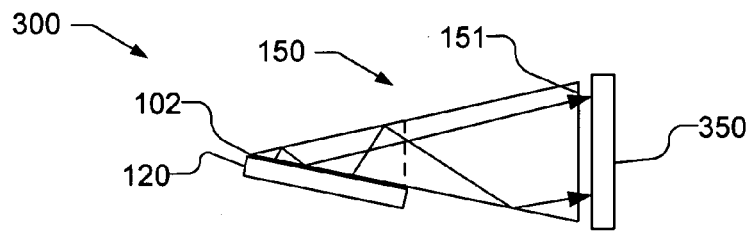
FIG. 8 illustrates an optical system that includes a light source, a transparent wedge and a target area.

By matching the dimensions of the exit surface 151 of the wedge to the dimensions of the target area, additional imaging optics can be obviated. FIG. 8 illustrates an illumination system 300 that includes the light source 102 and wedge 150 with a target area 350, which may be, e.g., a transparent microdisplay or other type of image panel, and no imaging optics are used.

Figure 9:
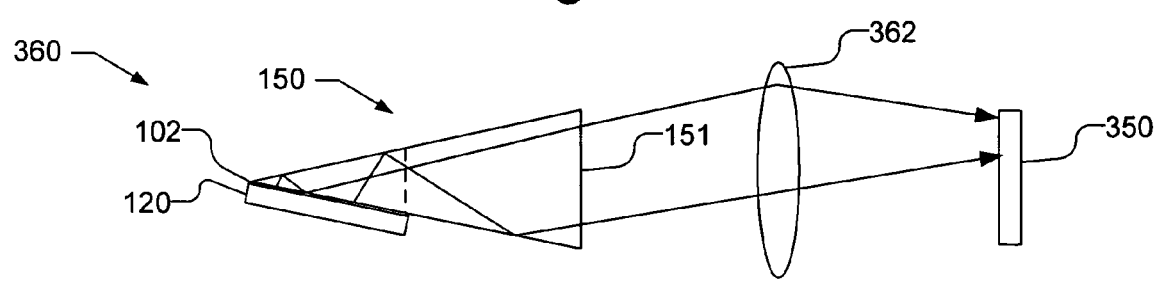
FIG. 9 illustrates an optical system that includes a light source, a transparent wedge and a target area with a lens disposed between the wedge and target area.

If desired, however, additional optical elements may be disposed between the wedge 150 and the target area 350. FIG. 9, by way of example, illustrates an illumination system 360 that includes the light source 102 and wedge 150 with an imagining lens system 362 disposed between the wedge 150 and a target area 350. The radiation emitted by the wedge 350 is imaged onto the target area 350 using the imagining lens system 352. This is particularly advantageous as the dimensions of the exit surface 151 of the wedge 150 need not match the dimensions of the target area 354.

If desired, the aspect ratio of the exit surface 151 of the wedge 150 can be matched to the aspect ratio of the target area, e.g., 4:3 for a standard television aspect ratio or 9:16 for a wide-screen application.

Figure 10:
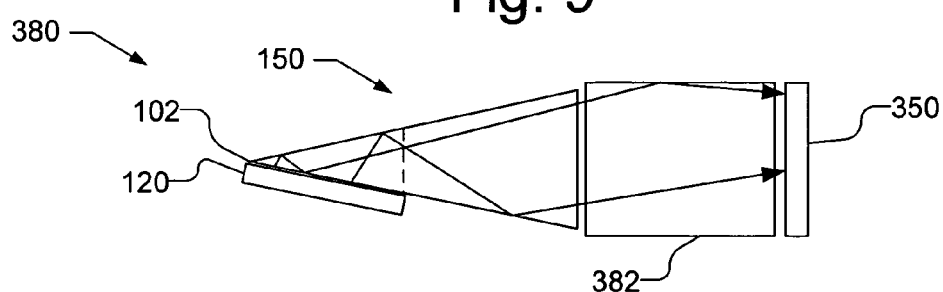
FIG. 10 illustrates an optical system that includes a light source, a transparent wedge and a target area with an integrator rod disposed between the wedge and target area.

FIG. 10 illustrates another embodiment of an illumination system 380 in which an integrator rod 382 is disposed between the exit surface 151 of the wedge 150 and the target area 350. The use of an integrator rod 382 may be used advantageously to make the light distribution more uniform.

Figure 11:
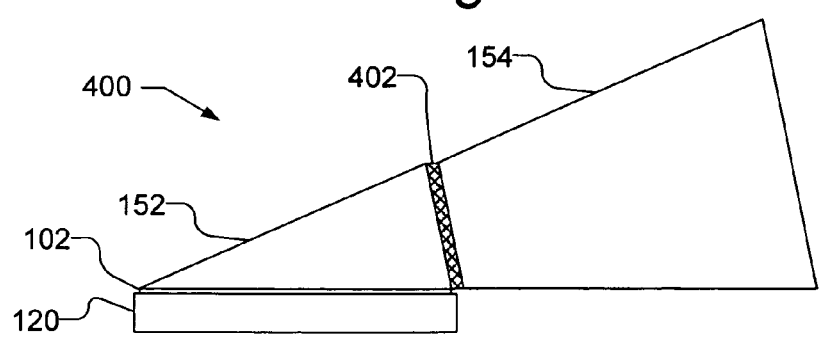
FIG. 11 illustrates an optical system that includes a light source, a first transparent member and a second transparent member that for a wedge, and a wavelength-converting material disposed between the first and second transparent members.

In addition, additional optical elements may be disposed between the small wedge element 152 and the wedge extension element 154. FIG. 11, for example, illustrates a device 400 in which wavelength-converting material 402 is disposed between the small wedge element 152 and the wedge extension element 154. Material 402 may be, for example, a fluorescent material such as phosphor. The material 402 can be used to convert emitted blue radiation form the LED to a desired color. For example, if active region 108 of the light source 102, shown in FIG. 2, is III-nitride such that the emission from active region 108 is blue, material 402 may be a Ce-doped Yttrium Aluminum Garnet (YAG) phosphor, which absorbs blue emission and emits yellow light. Yellow light from material 402 may mix with blue light from active region 108 such that the light that is emitted from the wedge extension element 154 appears as an intense white light source. The material 402, however, scatters the radiation. Thus, to maintain luminance of the source, the wedge extension element 154 is used to collimate the radiation.

Although the present invention is illustrated in connection with specific embodiments for instructional purposes, the present invention is not limited thereto. Various adaptations and modifications may be made without departing from the scope of the invention. Therefore, the spirit and scope of the appended claims should not be limited to the foregoing description.

What is claimed is:

1. An optical system comprising:
   at least a first light emitting diode;
   a transparent member having a first surface, a second surface, and an exit surface, the first light emitting diode disposed on the first surface of the transparent member, wherein a reflective coating is disposed on a portion of the first surface of the transparent member between the first light emitting diode and the exit surface of the transparent member; and one of a second light emitting diode and a reflective coating disposed on the second surface of the transparent member;
wherein the transparent member is shaped such that light emitted from the at least one light emitting diode is directed toward the exit surface of the transparent member; wherein the first surface of the transparent member and the second surface of the transparent member form a wedge with an apex opposite the exit surface.

2. The optical system of claim 1, wherein the first light emitting diode has a surface that is coupled to the first surface of the transparent member, the surface of the first light emitting diode having a width, wherein the portion of the first surface of the transparent member between the first light emitting diode and the exit surface of the transparent member extends a distance that is greater than the width of the surface of the first light emitting diode.

3. The optical system of claim 1, wherein the second surface of the transparent member is coated with a reflective coating, the device further comprising:
 a third surface of the transparent member;
 a fourth surface of the transparent member coated with a material reflective of light emitted from the first light emitting diode; and
 a second light emitting diode disposed on the third surface of the transparent member;
 wherein the first and third surfaces of the transparent member form a wedge with an apex opposite the exit surface, and the second and fourth surfaces are substantially parallel.

4. The optical system of claim 1, the transparent member comprising:
 a first optical element coupled to the first light emitting diode, the first optical element having an exit surface; and
 a second optical element having an entrance surface that is coupled to the exit surface of the first optical element, the second optical element having a surface that is the exit surface of the transparent member.

5. The optical system of claim 4, further comprising a wavelength-converting material disposed between the first optical element and the second optical element.

6. The optical system of claim 1, wherein the wedge has at least one non-planar surface.

7. The optical system of claim 1, further comprising an image panel upon which light emitted from the exit surface of the transparent member is incident.

8. The optical system of claim 7, further comprising at least one of a lens and an integrator rod disposed between the image panel and the exit surface of the transparent member.

9. The optical system of claim 1, further comprising a plurality of light emitting diodes disposed on the first surface of the transparent member, wherein the reflective coating is disposed on the portion of the first surface of the transparent member between any light emitting diode and the exit surface of the transparent member.

10. The optical system of claim 1, wherein the transparent member is selected from the group consisting of sapphire, glass, acrylic, and silicone.

11. An optical system comprising:
 a first light emitting diode;
 a first transparent member having a first surface, a second surface, and a first exit surface, the first light emitting diode disposed on the first surface, the first surface and second surface being opposite and non-parallel;
 one of a second light emitting diode and a reflective coating disposed on the second surface; and
 a second transparent member having a third surface, a fourth surface, an entry surface and a second exit surface, wherein the third surface and fourth surface are opposite and non-parallel and the entry surface and second exit surface are opposite, the entry surface is coupled to the first exit surface, a reflective coating is disposed on the third surface and the fourth surface;
 wherein the first transparent member and second transparent member are shaped such that light emitted from the first light emitting diode is directed toward the second exit surface.

12. The optical system of claim 11, wherein the first transparent member and second transparent member form a wedge with the first surface and second surface forming an apex opposite the second exit surface.

13. The optical system of claim 12, wherein the wedge has at least one non-planar surface.

14. The optical system of claim 11, wherein the first light emitting diode has a surface that is coupled to the first surface of the transparent member, the surface of the first light emitting diode having a width, wherein the third surface extends a distance between the entrance surface and the second exit surface that is greater than the width of the surface of the first light emitting diode.

15. The optical system of claim 11, further comprising a wavelength-converting material disposed between the first transparent member and the second transparent member.

16. The optical system of claim 11, further comprising an image panel upon which light emitted from the second exit surface is incident.

17. The optical system of claim 16, further comprising at least one of a lens and an integrator rod is disposed between the image panel and the second exit surface.

18. The optical system of claim 11, further comprising a plurality of light emitting diodes disposed on the first surface.

19. The optical system of claim 11, wherein the first transparent member and second transparent member are selected from the group consisting of sapphire, glass, acrylic, and silicone.

20. An optical system comprising:
 a first light emitting diode; and
 a wedge defined by the first light emitting diode along a first surface, a second inwardly reflective surface and a third inwardly reflective surface that are opposite each other and adjacent to the first surface, and a fourth inwardly reflective surface that is opposite and non-parallel with the first surface;
 wherein the wedge is shaped such that light emitted from the first light emitting diode is directed toward an exit area defined by a wide end of the wedge.

21. The optical system of claim 20, wherein the first surface and fourth inwardly reflective surface form an apex of the wedge that is opposite the exit area.

22. The optical system of claim 20, wherein at least a portion of the fourth inwardly reflective surface is formed by a second light emitting diode.

23. The optical system of claim 20, wherein at least a portion of the first surface between the first light emitting diode and the exit area is reflective.

24. The optical system of claim 23, wherein the wedge comprises a transparent member wherein the second inwardly reflective surface and third inwardly reflective surface are surfaces of the transparent member coated with a material reflective of light emitted from the first light emitting diode.

25. The optical system of claim 20, further comprising a plurality of light emitting diodes disposed along the first surface.

26. The optical system of claim 20, wherein the second inwardly reflective surface and third inwardly reflective surface are approximately perpendicular to the first surface.

27. The optical system of claim 20, wherein the wedge is defined as a cavity within solid body.

28. The optical system of claim 20, wherein the second inwardly reflective surface, third inwardly reflective surface and fourth inwardly reflective surface are separate reflective elements that are coupled together.

29. An optical system comprising:
    a first light emitting diode;
    a transparent member having a first surface, a second surface, and an exit surface, the first light emitting diode disposed on the first surface of the transparent member, wherein the first surface and the second surface are opposite each other and are non-parallel; and
    one of a second light emitting diode and a reflective coating disposed on the second surface of the transparent member;
    wherein the transparent member is shaped such that light emitted from the at least one light emitting diode is directed toward the exit surface of the transparent member, wherein at least a portion of the light emitted from the first light emitting diode is reflected by the first light emitting diode after being reflected by the one of a second light emitting diode and a reflective coating on the second surface of the transparent member before exiting the exit surface of the transparent member.

30. The optical system of claim 29, further comprising:
    a second light emitting diode disposed on the second surface of the transparent member, wherein the transparent member is shaped such that at least a portion of the light emitted from the first light emitting diode is reflected by the second light emitting diode disposed on the second surface of the transparent member.

* * * * *